(12) United States Patent
Taylor et al.

(10) Patent No.: US 7,132,214 B2
(45) Date of Patent: Nov. 7, 2006

(54) POLYMERS AND PHOTORESIST COMPOSITIONS FOR SHORT WAVELENGTH IMAGING

(75) Inventors: Gary N. Taylor, Northboro, MA (US); Robert L. Brainard, Wayland, MA (US); Shintaro Yamada, Marlborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 13 days.

(21) Appl. No.: 09/948,525

(22) Filed: Sep. 8, 2001

(65) Prior Publication Data

US 2002/0055061 A1  May 9, 2002

Related U.S. Application Data

(60) Provisional application No. 60/231,423, filed on Sep. 8, 2000, provisional application No. 60/252,664, filed on Nov. 22, 2000.

(51) Int. Cl.
*G03F 7/039* (2006.01)

(52) U.S. Cl. .................................. 430/270.1
(58) Field of Classification Search .............. 430/270.1
See application file for complete search history.

(56) References Cited

U.S. PATENT DOCUMENTS

| 3,975,352 A | | 8/1976 | Yoerger et al. |
| 4,752,635 A | | 6/1988 | Tsutsumi et al. |
| 5,128,232 A | * | 7/1992 | Thackeray et al. ......... 430/192 |

FOREIGN PATENT DOCUMENTS

| EP | 0 304 082 | | 2/1989 |
| EP | 0930542 A1 | * | 7/1999 |
| EP | 1 035 441 | | 9/2000 |
| EP | 1 103 856 | | 5/2001 |
| EP | 1 126 322 | | 8/2001 |
| EP | 1 164 434 | | 12/2001 |
| WO | WO 99 52957 | | 10/1999 |
| WO | WO 00 17712 | | 3/2000 |

OTHER PUBLICATIONS

"per-*", Grant et al, eds., Grant & Hackh's Chemical Dictionary: American, International, European and British Usage, Fifth Ed McGraw-Hill Book Company, New York, N.Y., 1987, p. 431 and cover and fly page.*
International Search Report of corresponding International Application No. PCT/US01/28206.
Roitman et al., "Wetting Properties of Bis(trifluoromethyl)carbinyl Acrylate Polymers", Journal of Polymer Science: Polymer Chemistry Edition, vol. 12, pp. 1421-1436, 1974.
Ogata et al., "New Polymer for 157nm Single-Layer Resist Based on Fluorine Containing Acryl Copolymer", Proceedings of the SPIE, vol. 4345, pp. 1048-1055, XP008001411, SPIE, Bellingham, VA, U.S., 2001.
Patent Abstracts of Japan, vol. 1998, No. 04, Mar. 31, 1998 & JP 09 325473 A (Japan Synthetic Rubber Co.), Dec. 16, 1997 (abstract).
Patent Abstracts of Japan, vol. 012, No. 300 Aug. 16, 1988 & JP 63 074054 A (Tosoh Corp.), Apr. 4, 1988 (abstract).
Patent Abstracts of Japan, vol. 013, No. 212 May 18, 1989 & JP 01 029837 A. (Tosoh Corp), Jan. 31, 1989 (abstract).
Database WPI, Section Ch, Week 199014, Derwent Publications ltd., London, GB; AN 1990-105164 & JP 02 058060A (Toa Gosei Chem. Ind. Ltd.), Feb. 27, 1990 (abstract).
Patent Abstracts of Japan, vol. 014, No. 208 Apr. 27, 1990 & JP 02 045509A (Tosoh Corp.), Feb. 15, 1990 (abstract).
Patent Abstracts of Japan, vol. 011, No. 058 Feb. 21, 1987 & JP 61 223733 A (Daikin Ind Ltd), Oct. 4, 1986, p. 250, col. 2 (abstract).
Chemical Abstracts, vol. 109, 109:219618, American Chemical Society, online version copyrighted 2002, one page.

* cited by examiner

*Primary Examiner*—Cynthia Hamilton
(74) *Attorney, Agent, or Firm*—Peter F. Corless; Darryl P. Frickey; Edwards Angell Palmer & Dodge LLP

(57) ABSTRACT

This invention relates to resins and photoresist compositions that comprise such resins. This invention includes new resins that comprise photoacid-labile deblocking groups, wherein the acid-labile moiety is substituted with one or more electron-withdrawing groups. Polymers of the invention are particularly useful as a resin binder component of chemically-amplified positive-acting resists that can be effectively imaged at short wavelengths such as sub-300 nm and sub-200 nm and preferably about 157 nm. In such short-wavelength imaging applications resins of the invention exhibit decreased absorbance of short wavelength exposure radiation, such as sub-170 nm radiation e.g. 157 nm.

5 Claims, No Drawings

POLYMERS AND PHOTORESIST COMPOSITIONS FOR SHORT WAVELENGTH IMAGING

This application claims the benefit of U.S. Provisional Application(s) No(s).: 60/231,423 having a filing date of Sep. 8, 2000 and 60/252,664 having a filing date of Nov. 22, 2000.

BACKGROUND OF THE INVENTION

1. Field of the Invention

The present invention includes new polymers and use of such polymers as a resin component for photoresist compositions, particularly chemically-amplified positive-acting photoresist compositions. Polymers and resists of the invention are particularly useful for imaging with short wavelength radiation, such as sub-200 nm and preferably about 157 nm. Preferred polymers of the invention contain one or more electron-withdrawing groups, particularly a halogen such as fluorine, as a substituent of a photoacid-labile moiety of the polymer.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 193 nm. Use of such short exposure wavelengths can enable formation of smaller features. Accordingly, a photoresist that yields well-resolved images upon 248 nm or 193 nm exposure could enable formation of extremely small (e.g. sub-0.25 m) features that respond to constant industry demands for smaller dimension circuit patterns, e.g. to provide greater circuit density and enhanced device performance.

Recently, use of an $F_2$ excimer laser imaging source which provides radiation having a wavelength of about 157 nm, has been considered as a route to manufacture of even smaller features. See, generally, Kunz et al., SPIE Proceedings (Advances in Resist Technology), vol. 3678, pages 13–23 (1999).

SUMMARY OF THE INVENTION

The invention provides new resins that comprise photoacid-labile deblocking groups, wherein the acid-labile moiety is substituted with one or more electron-withdrawing groups. Resins of the invention exhibit decreased absorbance of short wavelength exposure radiation, such as such as 200-nm radiation, particularly sub-170 nm radiation e.g. 157 nm.

Resins of the invention may contain a variety of photoacid-labile moieties, including e.g. photoacid-labile acetal groups, ketal groups, formal (—O—$CH_2$—O—) groups, ester groups and the like. The photoacid-labile groups are substituted by one or more electron-withdrawing or electronegative groups such as halogen particularly fluoro; halogenated alkyl such as halo($C_{1-12}$alkyl) particularly fluoroalkyl such as fluoro($C_{1-12}$alkyl) especially —$CF_3$ and other perfluoroalkyl; cyano; nitro, alkoxy particularly $C_{1-12}$alkoxy or $C_{1-6}$alkoxy; and substituted alkoxy particularly halogenated alkoxy such as halogenated particularly fluorinated $C_{1-12}$alkoxy such as —$CF_2OCH_3$; and the like.

Electron-withdrawing groups are bonded to blocking groups attached to polymer acidic sites. Such groups can reduce the polymer absorbance of high energy radiation, including sub-200 nm radiation such as 157 nm. Such reduced absorption permits use of the polymers in photoresists coated at optimum resist thicknesses. Preferred electron-withdrawing moieties of blocking groups include e.g. halogen preferably fluoro, perhaloalkyl such as perhalo$C_{1-8}$alkyl e.g. perfluoro$C_{1-8}$alkyl such as trifluoromethyl; CN, and OR (where R is an alkyl or cycloalkyl group with <7 carbon atoms), preferably bonded to the blocking group in such a way that the strong-acid catalyzed blocking and deblocking reactions are relatively unaffected by their presence. More particularly, preferably, one or more electronegative groups are positioned relatively "remotely" from an acidic site of the deblocking groups, e.g. at least 1, 2 or 3 carbon or other atoms positioned between a carbon substituted with an electronegative group and the acidic moiety such as carboxy or protected carboxy such as ester. By such "remote" positioning of the electronegative group(s), undesired absorption of exposure radiation can be minimized, but the electronegative groups are not close enough to or bonded conjugatively with the reactive site to adversely hinder its blocking and deblocking properties.

Photoresists of the invention in general comprise a polymer of the invention as discussed above and a photoactive component. Preferred photoactive components comprise a photoacid generator compound. Resists of the invention may be suitably imaged at a variety of exposure wavelengths. The resists are particularly suitable for imaging at shorter wavelengths, such as sub-300 nm or sub-200 nm radiation, e.g. 248 nm, 193 nm or 157 nm radiation.

The invention also includes methods for forming relief images, including methods for forming a highly resolved relief image such as a pattern of lines where each line has essentially vertical sidewalls and a line width of about 0.40 microns or less, or even about 0.25, 0.20, 0.15 or 0.10 microns or less. The invention further comprises provides articles of manufacture comprising substrates such as a microelectronic wafer having coated thereon the photoresists and relief images of the invention. Other aspects of the invention are disclosed infra.

DETAILED DESCRIPTION OF THE INVENTION

We provide to new acid-labile protecting group of acidic functional groups of resist polymers. The new protecting group of the invention suitably can be introduced by polymerizing monomeric precursors that contain the new protecting groups. The new acid labile protecting group can be incorporated into olefinic monomers such as acrylates particularly (meth)acrylate, alpha-trifluoroacrylate, carboxyl norbornene derivatives.

Preferred deblocking groups of the invention are esters, acetals or ketals, where one or more electron-withdrawing groups are substituted onto the ester, acetal or ketal moiety, particularly onto an alkyl, alkene, alkynyl, heteroalkyl, heteroalkene or heteroalkynyl portion of the ester, acetal or ketal, e.g. an ester group of the formula —C(═O)O—X or an acetal group of the formula —C(═O)O(optionally substituted alkylene having 1 to 3 carbons)O—X, where X in those formulae is alkyl, alkene, alkynyl, heteroalkyl, heteroalkene or heteroalkynyl having from 4 to about 20 carbons and substituents of one or more electron withdrawing groups particularly one or more halogen such as fluoro. Preferably, for ester acid labile groups, the carbon bonded to the carboxyl oxygen (i.e. the underlined oxygen of the formula: —C(═O)O-alkyl) is bonded to a quaternary carbon, i.e. is an unsaturated carbon that has no hydrogen substituents.

Particularly preferred polymers for use in resists of the invention include acrylate-type deblocking groups such as of the following Formula I, II, III, IV, V, VI, VII and VIII.

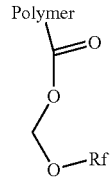

I

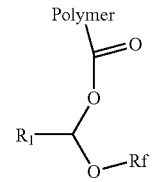

II

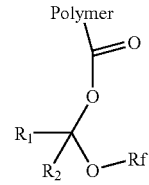

III

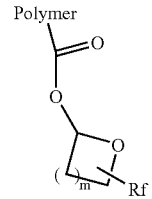

IV

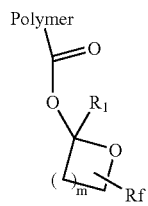

V

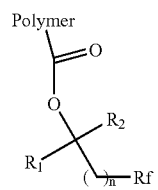

VI

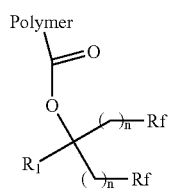

VII

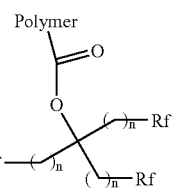

VIII

In each of those Formulae I, II, III, IV, V, VI, VII, and VIII:

$R_1$ and $R_2$ are each independently optionally substituted alkyl preferably having from 1 to about 20 carbon, optionally substituted alkene preferably having 2 to about 20 carbon atoms, optionally substituted alkynyl preferably having 2 to about 20 carbon atoms, optionally substituted heteroalkyl preferably having 1 to about 20 carbon atoms, optionally substituted heteroalkene preferably having 2 to about 20 carbon atoms, or optionally substituted heteroalkynyl preferably having 2 to about 20 carbon atoms;

each Rf is an optionally substituted fluorinated alkyl preferably having from 1 to about 20 carbon, optionally substituted fluorinated alkene preferably having 2 to about 20 carbon atoms, optionally substituted fluorinated alkynyl preferably having 2 to about 20 carbon atoms, optionally substituted fluorinated heteroalkyl preferably having 1 to about 20 carbon atoms, optionally substituted fluorinated alkene preferably having 2 to about 20 carbon atoms, or optionally substituted fluorinated heteroalkynyl preferably having 2 to about 20 carbon atoms; and optionally substituted fluorinated carbocyclic aryl;

n is an integer of from 1 to about 20, and preferably n is 2, 3 or 4; and m is an integer of from 0 to 7, and preferably m is 2 to 4.

In those Formulae I through VIII, the Rf group may have one or more fluorine substituents. Perfluoro substituents are particularly preferred such as perfluoro($C_{1-12}$)alkyl, perfluoro($C_{1-12}$)alkoxy, pentafluorophenyl, and the like. By stating that the Rf groups may be optionally substituted indicates that the group may have other substitution in addition to one or more fluorine.

In the above Formulae I through VIII, the depicted "polymer" is suitably a polymer backbone, e.g. a saturated polymer backbone onto which the depicted units are bound.

In the above Formulae I through VIII, preferred $R_1$, $R_2$ and Rf groups are saturated, i.e. preferably $R_1$, $R_2$ and Rf are the same or different and are each optionally substituted alkyl or optionally substituted heteroalkyl, preferably optionally substituted alkyl.

As discussed above, preferably electronegative groups are positioned relatively remotely from the acidic site of a photoacid-labile deblocking group. For example, in the below-depicted system 1, to effectively reduce undesired absorbance with minimal effect on the deblocking reactive site an electron withdrawing group (E) is optimally positioned at ring positioned beta to the ring-oxygen bonds. E is an electronegative group and is suitably e.g. F, $CF_3$, CN, $OCH_3$ and O-(short alkyl e.g. $\leq C_7$). See structure 1 below.

For many electronegative groups, positioning at the alpha position as shown in structure 2 below would afford more destabilization of the carbocation intermediate formed at the reactive site and would be less advantageous. However, alkoxy electronegative groups, preferably $C_{1-6}$alkoxy groups can uniquely reduce undesired absorption as well as stabilize the carbocation formed during a photoacid-induced deprotection reaction.

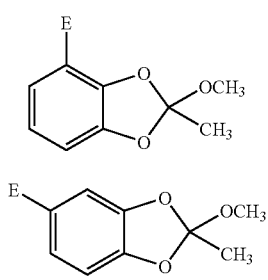

Polymers containing such deblocking groups can be readily prepared. For example, such blocking groups can be grafted onto a preformed polymer as generally depicted in the following Scheme (A):

Scheme (A)

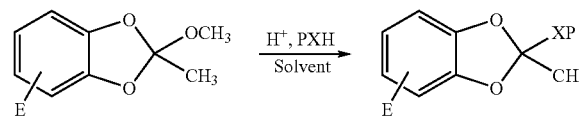

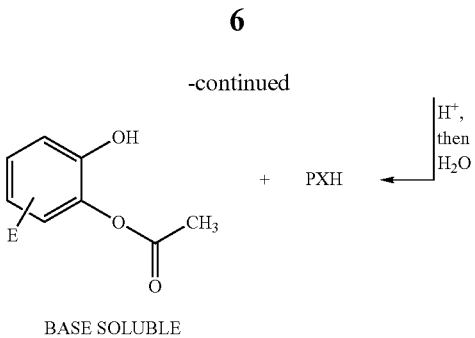

BASE SOLUBLE

In the above Scheme, E is an electronegative group, PXH is a polymer containing acidic groups XH. The Scheme further shows the deprotection reaction where the photoacid (H+) and $H_2O$ yields the base soluble polymer.

Similarly, if a substituted styrene or alpha-methyl styrene is employed as a deblocking group, the electron-withdrawing group is optimally a meta substituent, as shown below, in the following structure 4, where E is an electronegative group such as fluorine. Also, however, as discussed, alkoxy electronegative groups suitably can be ortho substituents.

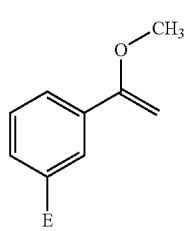

Various steric configurations of deblocking groups of polymers of the invention also may be preferred. Polymers that permit relative facile attack by photoacid may be preferred, such as a polymer of the following structure:

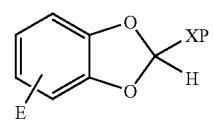

where E, X, and P are the same as defined above in Scheme (A).

As discussed above, deblocking groups also may be suitably non-aromatic, such as deblocking groups that contain alicyclic moieties. For instance, suitable deblocking groups include the following structure 5 where the substituents E in those structures is an electronegative group such as fluorine or trifluoromethyl.

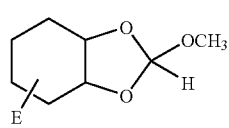

Fluorine-containing tertiary alcohol monomers can be prepared by the reactions as exemplified in the following Scheme 1, and similar reactions are reported by Curran et al., *J. Org. Chem.*, 66, 4261 (2001).

Scheme 1

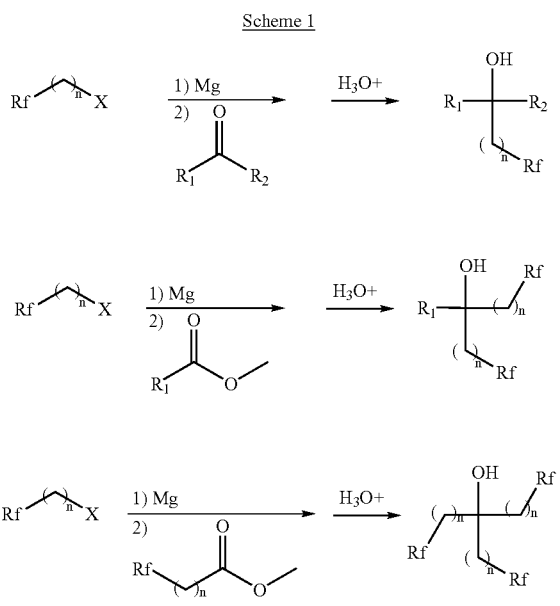

In Scheme 1 above, $R_1$ and $R_2$ are each preferably a non-hydrogen substituent, preferably a non-aromatic substituent for sub-200 nm imaging, such as optionally substituted alkyl preferably having 1 to about 16 carbon atoms, more preferably having 1 to about 6 carbon atoms and suitably substituted with one or more electron-withdrawing groups such as halogen especially fluoro. For instance, preferred $R_1$ and $R_2$ groups include —$CH_3$, —$CH_2CH_3$, —$CF_3$, $CH_2CF_3$, —$CF_2CF_3$, and the like. In the above Scheme 1, Rf is an electron-withdrawing group and may be e.g. an alkyl group having one or more electro-withdrawing substituents, such as an alkyl group having 1 to about 16 carbon atoms and more preferably 1 to about 6 carbon atoms that has one or more halogen substituents particularly fluoro such as —$CF_3$, —$CF_2CF_3$, $CH_2CF_3$, and the like. In Scheme 1, X is suitably halogen such as Cl, Br or I; n is suitably 1 to about 20, preferably 1, 2, 3, or 4, more preferably 2, 3 or 4; and m is suitably 0 to about 7, preferably 1, 2, 3, or 4, more preferably 2, 3 or 4.

For use in the reactions of Scheme 1 above, a variety of fluorinated alkyl halides particularly alkyl iodides, bromides and chlorides are commercially available, and can be used for this application. For example, 1H,1H,2H,2H-perfluorohexyl bromide, 1H,1H,2H,2H-perfluorododecyl iodide and similar fluorinated alkyl halides are available from Matrix Scientific Co. Also, fluorine-containing alkyl halides can be prepared by etherification reaction of fluorinated alcohols as shown in the following Scheme 2.

Scheme 2

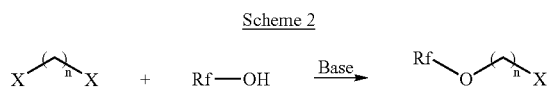

The above shown halides are readily converted to the Grignard reagent, and can react with ketones or esters to form the tertiary alcohol as shown in Scheme 1 above. A variety of alkyl ketones such as acetone, isopropylmethylketone, diisopropylketone or caged ketones (i.e. carbon alicyclic group having from 5 to about 20 ring carbons and preferably 1, 2, 3 or 4 linked rings and at least one keto (>C(=O)) ring atoms such as norcamphor and adamantanone can be used to prepare the tertiary alcohols. Alternatively, alkyl lithium can be used instead of Mg to prepare the same alcohols. These alcohols can be then reacted with (meth)acryloyl chloride or α-trifluoromethylacryloyl chloride to form tertiary ester (see Scheme 3 below). The acrylic monomers can be used to produce polymers as well as the norbornene adduct by Diels-Alder reaction with cyclopentadiene. These cycloadducts can also be used to provide polymers for photoresist applications.

Scheme 3

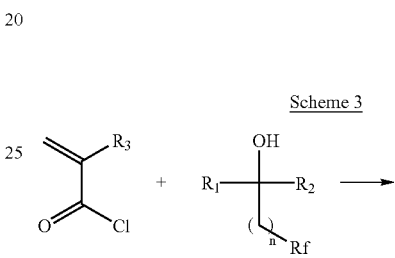

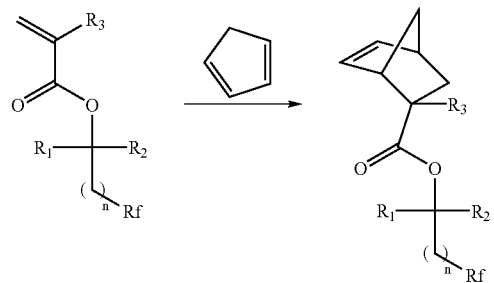

In Scheme 3 above, $R_1$, $R_2$, $R_f$ and n are the same as specified above in Scheme 1, and $R_3$ is hydrogen, optionally substituted alkyl having from 1 to about 12 carbons, preferably 1 to about 3 carbons such as methyl, trifluoromethyl and the like.

Fluorine-containing vinyl ether groups can be prepared in a variety of ways, including the exemplary procedure depicted in Scheme 4 above. In that Scheme 4, commercially available 2-chloroethylvinyl ether and fluorinated alkylalcohols can be reacted to form the fluorine-containing vinyl ether. This vinyl ether can be used to protect carboxylic acid as shown in Scheme 5 or phenols. These protected monomers can be used to provide the polymers as previously discussed.

Scheme 4

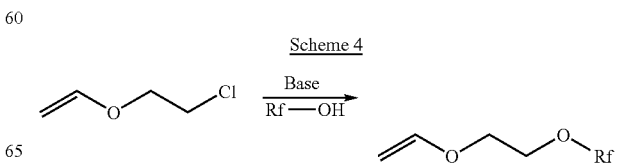

Scheme 5

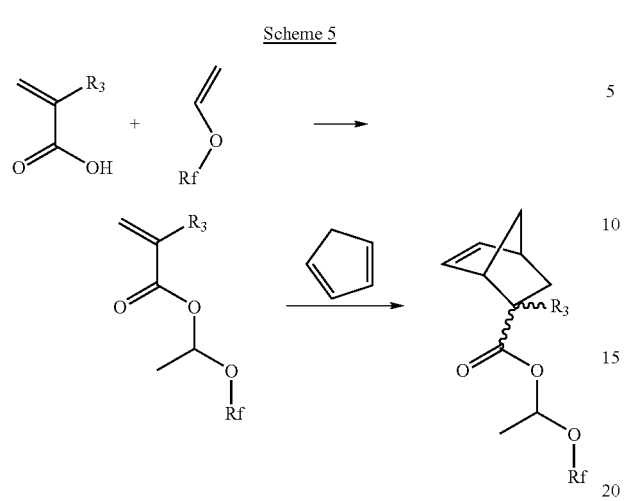

In Schemes 4 and 5, Rf and R3 are the same as specified above in Scheme 3. These monomers, (meth)acrylates and their cycloadduct of cyclopentadiene with fluorine-containing acid labile protecting groups, can be polymerized to form a variety of polymers for photoresist application. Thus, acid-labile groups may be incorporated into optionally substituted norbornene derivatives and α-trifluoromethyacrylates, with an acid-labile group incorporated into either or both a norbornene unit or α-trifluoromethyacrylate unit of a polymer. See the exemplary polymer structures below. Norbornene-based polymers containing an acid-labile group as disclosed herein can be synthesized by metal-catalyzed addition polymerization. Suitable procedures are disclosed in WO9914256 and WO9733198. Norbornene compounds also can be co-polymerized with tetrafluoroethylene. See WO0017712. The acrylates monomers containing an acid-labile group as disclosed herein also can be radically polymerized with fluorine-containing monomers such as styrene-hexafluoroisopropanol to provide a polymer of the invention. Acrylates monomers containing an acid-labile group as disclosed herein also can be reacted with a fluorinated carbocyclic aryl compound such as a fluorinated styrene or fluorinated vinylphenol, or an acrylate containing bis(hexafluoroisopropan-2-ol)cyclohexane. See *SPIE Proceedings* (Society for Optical Engineering), 500 (1992); Ito et al., *Journal Polymer Science Technology*, 584 (2001); and Ober et al., *Journal Polymer Science Technology*, 613 (2001).

Suitable exemplary polymers useful in resists of the invention may comprise structures of the following formulae. In those formulae, Rf is the same as defined in the above Schemes.

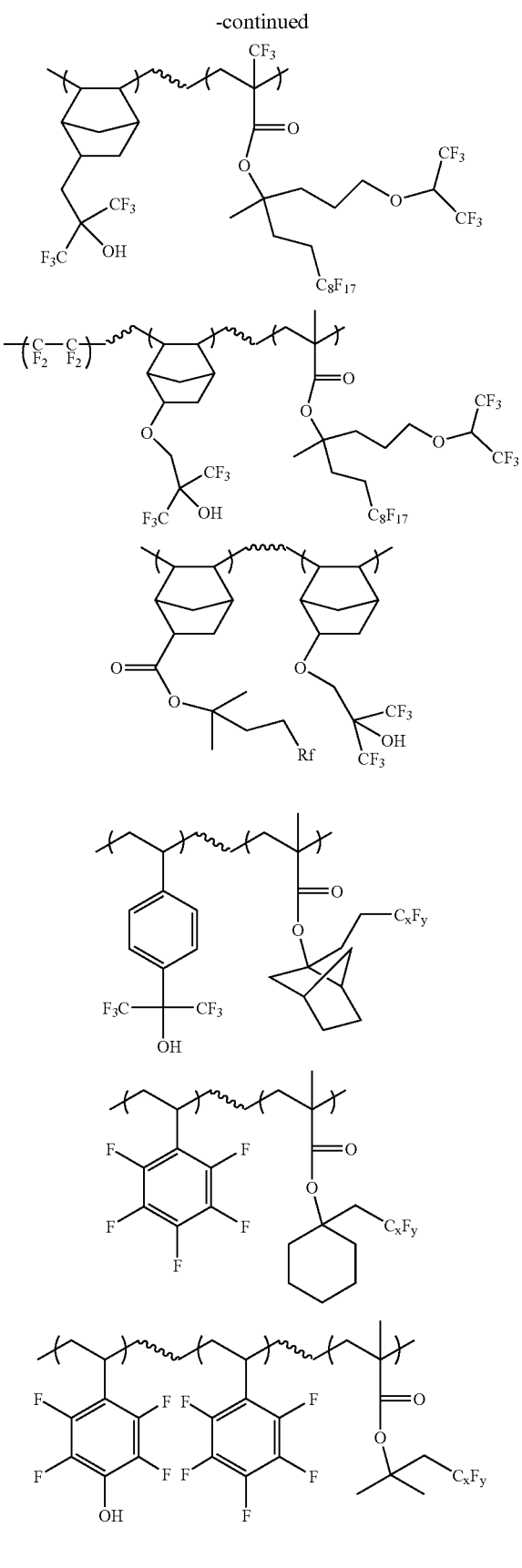

-continued

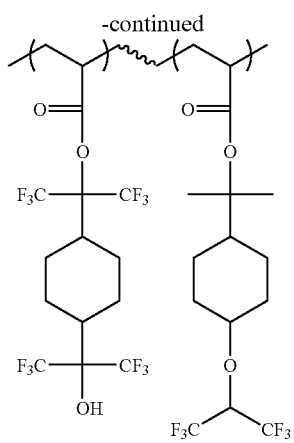

Polymers of the invention may be substantially free of aromatic groups. More particularly, preferred polymers that are substantially free of aromatic groups contain less than about 5 mole percent aromatic groups, more preferably less than about 1 or 2 mole percent aromatic groups, more preferably less than about 0.1, 0.08, 0.04 and 0.02 mole percent aromatic groups and still more preferably less than about 0.01 mole percent aromatic groups. Particularly preferred polymers are completely free of aromatic groups. Aromatic groups can be highly absorbing of sub-200 nm radiation and thus can be undesirable for polymers used in photoresists imaged with such short wavelength radiation.

Suitable polymers that are substantially or completely free of aromatic groups suitably contain fused non-aromatic alicyclic groups such as may be provided by polymerization of a norbornene compound or other alicyclic compound having an endocyclic carbon-carbon double bond; an anhydride such as may be provided by polymerization of maleic anhydride; and the like. Polymerized acrylate units such as photoacid-labile acrylate units also may be employed, such as groups provided by polymerization of methyladamanatylacrylate, methyladamanylmethacrylate, ethylfencylacrylate, ethylfencylmethacrylate, and the like;

The term "heteroalkyl" as used herein is inclusive of alkoxy, alkylthio, alkylamino, alkylsulfinyl and alkylsulfonyl. The term "heteroalkenyl" as used herein is inclusive of such alkoxy, alkylthio, alkylamino, alkylsulfinyl and alkylsulfonyl groups that further include one or more carbon-carbon double bonds, typically one or two carbon-carbon double bonds. The term "heteroalkynyl" as used herein is inclusive of such alkoxy, alkylthio, alkylamino, alkylsulfinyl and alkylsulfonyl groups that further include one or more carbon-carbon triple bonds, typically one or two carbon-carbon triple bonds. For polymers of the invention, heteroalkyl, heteroalkenyl and heteroalkynyl groups having nitrogen atoms are less preferred.

As discussed above, $R_1$, $R_2$, $R_3$ and other groups are optionally substituted. A "substituted" $R_1$, $R_2$, $R_3$ or other group may be substituted by other than hydrogen at one or more available positions, typically 1 to 3 or 4 positions, by one or more suitable groups such as those disclosed herein. Suitable groups that may be present on a "substituted" $R_1$, $R_2$, $R_3$ or other group include e.g. halogen such as fluoro, chloro, bromo and iodo; cyano; hydroxyl; nitro; azido; alkanoyl such as a $C_{1-6}$ alkanoyl group such as acyl and the like; carboxamido; alkyl groups including those groups having 1 to about 12 carbon atoms, or 1, 2, 3, 4, 5, or 6 carbon atoms; alkenyl and alkynyl groups including groups having one or more unsaturated linkages and from 2 to about 12 carbon, or 2, 3, 4, 5 or 6 carbon atoms; and alkoxy groups including those having one or more oxygen linkages and from 1 to about 12 carbon atoms, or 1, 2, 3, 4, 5 or 6 carbon atoms; alkylthio groups including those moieties having one or more thioether linkages and from 1 to about 12 carbon atoms, or 1, 2, 3, 4, 5 or 6 carbon atoms; alkylsulfinyl groups including those moieties having one or more sulfinyl linkages and from 1 to about 12 carbon atoms, or 1, 2, 3, 4, 5, or 6 carbon atoms; and alkylsulfonyl groups including those moieties having one or more sulfonyl linkages and from 1 to about 12 carbon atoms, or 1, 2, 3, 4, 5, or 6 carbon atoms.

It also has been found that polymers of the invention may contain aromatic groups and will not exhibit excessive absorbance of short wavelength exposure radiation, such as sub-170 nm or sub-160 nm radiation, particularly 157 nm exposure radiation. As discussed above, such aromatic groups preferably have one or more ring substituents that are electron-withdrawing groups, e.g. halogen particularly fluoro; or perhaloalkyl, particularly perfluoroalkyl such as trifluoromethyl.

As discussed above, polymers of the invention can be prepared by free radical polymerization, e.g., by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction temperatures for any particular system can be readily determined empirically by those skilled in the art.

A reaction solvent may be employed if desired. Suitable solvents include alcohols such as propanols and butanols and aromatic solvents such as benzene, chlorobenzene, toluene and xylene. Dimethylsulfoxide and dimethylformamide are also suitable. The polymerization reaction also may be run neat.

A variety of free radical initiators may be employed to prepare the copolymers of the invention. For example, azo compounds may be employed such as azo-bis-2,2'-isobutyronitrile (AIBN) and 1,1'-azobis(cyclohexanecarbonitrile). Peroxides, peresters, peracids and persulfates also can be employed.

Blocking groups can be grafted onto such formed polymers as described above such as described in Example 1.

Preferably a polymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, the polymers of the invention are highly useful as the resin binder component in photoresist compositions, particularly chemically-amplified positive resists. Photoresists of the invention in general comprise a photoactive component and a resin binder component that comprises a polymer as disclosed herein.

The resin binder component preferably is used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation.

Generally preferred are onium salt PAGs, particularly sulfonium and iodonium PAGs, preferably with a sulfonate or carboxylate counter anion. Sulfonate salts are generally preferred, particularly such salts that generate a strong acid upon photoactivation, such as a perfluoroalkylsulfonic acid. For instance, preferred sulfonate PAGs include the following:

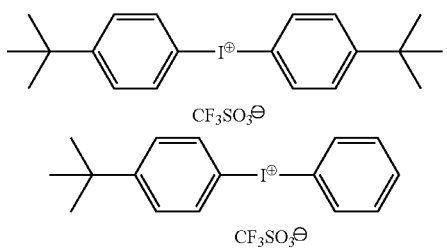

Other known PAGs can be employed. For instance, see PAGs reported in J. of Photopolymer Science and Technology, 4(3):337–340 (1991) and U.S. Pat. No. 5,344,742.

A preferred optional additive is an added base, such as particularly tetrabutylammonium hydroxide (TBAH), or other TBAH salts, which can enhance resolution of a developed resist relief image. The added base is suitably used in relatively small amounts, e.g. about 0.1 to 4 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

Photoresists of the invention can be readily prepared. For example, a resist of the invention can be prepared as a coating composition by dissolving the components of the photoresist (e.g., the resin and a PAG) in a suitable solvent such as, e.g., a glycol ether such as 2-methoxyethyl ether (diglyme), ethylene glycol monomethyl ether, propylene glycol monomethyl ether, lactates such as ethyl lactate or methyl lactate, with ethyl lactate being preferred; proponiates, particularly methyl propionate, ethyl propionate and ethyl ethoxy propionate; or a ketone such as methylethyl ketone, cyclohexanone and 2-heptanone. Cyclohexanone and 2-haptanone are generally preferred. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation such as 157 nm or other short wavelength radiation, optionally post-exposure baked to create or enhance solubility differences between exposed and nonexposed regions of the resist coating layer, and then developed preferably with an aqueous alkaline developer to form a relief image. Following development of the photoresist coating over the substrate, the developed substrate may be selectively processed on those areas bared of resist, e.g. by chemically etching or plating substrate areas bared or resist in accordance with known procedures. For the manufacture of microelectronic substrates, e.g. the manufacture of silicon dioxide wafers, suitable etchants include a gas etchant, e.g. a chlorine or fluorine-based etchant such as a $CF_4$ or $CF_4/CHF_3$ etchant applied as a plasma stream.

All documents disclosed herein are incorporated herein by reference. The following non-limiting examples are illustrative of the invention.

EXAMPLE 1

Polymer Synthesis

Poly(4-hydroxystyrene) (PHS) and an acid (methane sulfonic acid) are dissolved in tetrahydrofuran (THF). To this solution heated at reflux is added the following compound 6:

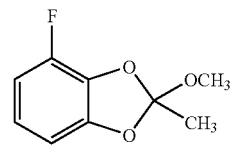

Compound (6) is prepared by reacting 2-fluorocatechol with methylchloroacetate in the presence of acid. The corresponding 3-fluoro and 2,3-difluoro compounds can be prepared in the same fashion.) Then 0.3 equivalents of trifluoroacetic acid is added. Heating at reflux is continued for a time sufficient to react approximately 20 mole percent of the phenolic sites in PHS, giving a copolymer which is precipitated by addition of organic solvent such as heptane. The resulting precipitate is isolated by filtration, rinsed with hexane and dried.

EXAMPLE 2

Photoresist Preparation and Lithographic Processing

A photoresist of the invention is prepared by mixing the following components with amounts expressed as weight percent based on total weight of the resist compositions:

| Resist components | Amount (wt. %) |
|---|---|
| Resin binder | 15 |
| Photoacid generator | 3 |
| Cyclohexanone | 81 |

The resin binder is the terpolymer of Example 1 above. The photoacid generator is di-t-butylphenyl iodonium perfluorbutane sulfonate. Those resin and PAG components are admixed in cyclohexanone solvent.

The formulated resist composition is spin coated onto HMDS vapor primed 4 inch silicon wafers and softbaked via a vacuum hotplate at 90° C. for 60 seconds. The resist coating layer is exposed through a photomask at 157 nm, and then the exposed coating layers are post-exposure baked at 110° C. The coated wafers are then treated with aqueous alkaline solution to develop the imaged resist layer.

EXAMPLE 3

Synthesis of 4-perfluorooctyl-2-methylbutane-2-ol

The title compound can be prepared as described in Curran et al., *J. Org. Chem.*, 66, 4261 (2001)). To a 100 mL 3-neck round bottom flask is added Mg powder (0.36 g, 0.015 mol) and dry ether (10 mL). To this mixture is added 1,1,1,2,2,3,3,4,4,5,5,6,6,7,7,8,8-heptadecafluoro-1-iododecan (1.0 g, 0.0017 mol), and the mixture is warmed to initiate the reaction. A solution of 1,1,1,2,2,3,3,4,4,5,5,6,6,7,7,8,8-heptadecafluoro-1-iododecan (4.73 g, 0.00824 mol) in 30 mL of dry ether is slowly added to the mixture under gentle refluxing. This mixture is refluxed for about 1 hour. After cooling down to room temperature, a solution of acetone (0.87 g, 0.015 mol) in dry ether (10 mL) is slowly added to the mixture, and stirred at room temperature overnight. The reaction is quenched by diluted hydrochloric acid, and the aqueous phase is extracted by ether. The ether phase is combined, washed with water until neutral, and dried over $MgSO_4$. After evaporation of solvent, the residue is purified by column chromatography.

EXAMPLE 4

Synthesis of 1,5-Bis(perfluorooctyl)-3-methylpentan-3-ol

The title compound can be prepared by the same procedure as shown for 4-perfluorooctyl-2-methylbutane-2-ol but ethyl acetate was used instead of acetone.

EXAMPLE 5

Synthesis of 4-perfluorooctyl-2-methylbutane-2-yl methacrylate

To a 100 mL three-neck flask attached with an dropping funnel, a thermometer and a nitrogen inlet is added 4-perfluorooctyl-2-methylbutane-2-ol (1.0 g, 0.0020 mol), dry dichloromethane (10 mL) and triethylamine (freshly distilled, 0.3 g, 0.0030 mol), and the solution is cooled with an ice bath. A solution of methacryloyl chloride (0.25 g, 0.0024 mol) in dry dichloromethane (10 mL) is slowly added to the alcohol solution keeping the reaction temperature below 10° C. The ice bath is removed, and the mixture is stirred at room temperature for 1 hour. The resulting mixture is poured into 1 L of water, and organic phase is saved. The aqueous phase is twice extracted with dichloromethane. The organic phases are combined, washed with water until neutral, and dried over $MgSO_4$. After evaporation of the solvent, the residue is suitably purified by column chromatography.

EXAMPLE 6

Synthesis of 1,5-bis(perfluorooctyl)-3-methylpentan-3-yl methacrylate

The title compound can be prepared by the same procedure as stated for 4-perfluorooctyl-2-methylbutane-2-yl methacrylate using 1,5-bis(perfluorooctyl)-3-methylpentan-3-yl instead of 4-perfluorooctyl-2-methylbutane-2-ol.

EXAMPLE 7

Polymerization of 4-perfluorooctyl-2-methylbutane-2-yl methacrylate and pentafluorostyrene and 4-hydroxy-2,3,5,6-tetrafluorostyrene To a 100 mL one-neck round bottom flask is added 4-perfluorooctyl-2-methylbutane-2-yl methacrylate (1.0 g, 0.0017 mol), pentafluorostyrene (0.33 g, 0.0017 mol), 4-hydroxy-2,3,5,6-tetrafluorostyrene (0.33 g, 0.0017 mol), 2,2-azobiisobutyronitrile (0.025 g, 0.00015 mol) and THF (inhibitor free, 8 mL). The solution is degassed by freeze-pump-thaw cycles, and heated at 70° C. overnight. The resulting solution is poured into 100 mL of hexanes to give the polymer. The polymer can be reprecipitated from THF to hexanes, and dried in vacuo at 50° C. overnight.

EXAMPLE 8

Polymerization of 1,5-bis(perfluorooctyl)-3-methylpentan-3-yl methacrylate and pentafluorostyrene and 4-hydroxy-2,3,5,6-tetrafluorostyrene To a 100 mL one-neck round bottom flask is added 1,5-bis(perfluorooctyl)-3-methylpentan-3-yl methacrylate (1.71 g, 0.0017 mol), pentafluorostyrene (0.33 g, 0.0017 mol), 4-hydroxy-2,3,5,6-tetrafluorostyrene (0.33 g, 0.0017 mol), 2,2-azobiisobutyronitrile (0.025 g, 0.00015 mol) and THF (inhibitor free, 8 mL). The solution is degassed by freeze-pump-thaw cycles, and heated at 70° C. overnight. The resulting solution is poured into 100 mL of hexanes to give the white polymer. The polymer can be reprecipitated from THF to hexanes, and dried in vacuo at 50° C. overnight.

EXAMPLE 9

Photoresist Preparation

A photoresist sample is formulated with poly(4-perfluorooctyl-2-methylbutane-2-yl methacrylate-co-pentafluorostyrene-co-4-hydroxy-2,3,5,6-tetrafluorostyrene) (1.0 g), triphenylsulfonium nonaflate (5 wt %), tetrabutylammonium lactate (0.4 wt %) and 2-heptanone (referred to herein a Resist A). This solution is filtered by 0.2 um PTFE syringe filter prior to spin coating. Photoresist samples with poly(1,5-bis(perfluorooctyl)-3-methylpentan-3-yl methacrylate-co-pentafluorostyrene-co-4-hydroxy-2,3,5,6-tetrafluorostyrene) (referred to herein as Resist B) and poly(tert-butyl methacrylate-co-pentafluorostyrene-co-4-hydroxy-2,3,5,6-tetrafluorostyrene) (referred to herein as Resist C) are prepared in the same formulation.

The photoresist samples prepared above (i.e. Resists A through C) are spin coated on 8" silicon wafers primed with HMDS vapor, and baked at 120° C. for 60 seconds to give film thickness approximately 160 nm. The wafers are exposed to 157 nm light through phase-shift mask, baked at 130° C. for 60 seconds, and developed with Shipley LDD-26W developer to provide relief images.

The foregoing description of the invention is merely illustrative thereof, and it is understood that variations and modifications can be effected without departing from the spirit or scope of the invention as set forth in the following claims.

What is claimed is:

1. A photoresist composition comprising one or more photoacid generator compounds and a resin that is completely free of aromatic groups aromatic and comprises photoacid-labile deblocking groups,
   wherein the deblocking groups comprise a reactive acetal or ketal group substituted with one or more electronegative moieties.

2. The photoresist composition of claim 1 wherein the one or more electronegative moieties are spaced by one or more atoms from the one or more deblocking groups.

3. The photoresist composition of claim 1 wherein the electronegative moieties are selected from the group of halogen, cyano, haloalkyl and alkoxy.

4. An article of manufacture comprising a substrate having thereon a coating layer of a photoresist composition of claim 1.

5. The article of claim 4 wherein the article is a microelectronic wafer substrate.

* * * * *